United States Patent
Lim et al.

(10) Patent No.: US 12,463,591 B2
(45) Date of Patent: Nov. 4, 2025

(54) DEVICE AND METHOD FOR ADAPTIVE LOOP GAIN OF OSCILLATOR

(71) Applicant: Samsung Electronics Co., Ltd., Suwon-si (KR)

(72) Inventors: Dokyung Lim, Suwon-si (KR); Junhyeok Yang, Suwon-si (KR); Chanyoung Jeong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 20 days.

(21) Appl. No.: 18/400,098

(22) Filed: Dec. 29, 2023

(65) Prior Publication Data
US 2024/0235476 A1    Jul. 11, 2024

(30) Foreign Application Priority Data
Jan. 5, 2023  (KR) ........................ 10-2023-0001939

(51) Int. Cl.
*H03B 5/12*   (2006.01)
*H03L 3/00*   (2006.01)

(52) U.S. Cl.
CPC ......... *H03B 5/1212* (2013.01); *H03B 5/1234* (2013.01); *H03L 3/00* (2013.01); *H03B 2200/0082* (2013.01); *H03B 2200/0094* (2013.01)

(58) Field of Classification Search
CPC .. H03B 5/1228; H03B 5/1212; H03B 5/1215; H03B 5/08; H03B 5/12; H03B 5/1203; H03B 5/1206; H03B 2200/0094; H03B 5/06; H03B 5/1278; H03B 5/1234; H03L 3/00
See application file for complete search history.

(56) References Cited

U.S. PATENT DOCUMENTS

| | | | |
|---|---|---|---|
| 7,292,115 B2 | 11/2007 | Soltanian et al. | |
| 7,592,878 B2 * | 9/2009 | Fagg | H03L 3/00 327/337 |
| 8,134,417 B2 * | 3/2012 | Chiang | H03L 5/00 331/109 |
| 8,319,568 B2 | 11/2012 | Sun | |
| 8,896,390 B2 | 11/2014 | Chen | |
| 9,369,085 B1 * | 6/2016 | Leong | H03B 5/1225 |
| 9,467,092 B1 | 10/2016 | Dreps et al. | |

(Continued)

FOREIGN PATENT DOCUMENTS

| | | |
|---|---|---|
| KR | 101996-0027347 | 7/1996 |
| KR | 101344893 B1 | 12/2013 |

OTHER PUBLICATIONS

Partial European Search Report dated May 29, 2024 for corresponding European Application No. 23220530.2.

*Primary Examiner* — Ryan Johnson
(74) *Attorney, Agent, or Firm* — Harness, Dickey & Pierce, P.L.C.

(57) ABSTRACT

A device includes an oscillator including at least one inductor and at least one capacitor and configured to generate, based on a positive supply voltage, an output signal oscillating in a resonance frequency of the at least one inductor and the at least one capacitor. The device further includes an oscillation detector configured to determine whether the output signal oscillates based on a clock signal and increase a loop gain of the oscillator until the output signal oscillates.

19 Claims, 15 Drawing Sheets

(56) References Cited

U.S. PATENT DOCUMENTS

| | | |
|---|---|---|
| 9,966,962 B2 | 5/2018 | Abe et al. |
| 10,715,152 B2 | 7/2020 | Kubo et al. |
| 2004/0056725 A1* | 3/2004 | Kitamura ............. H03B 5/1243 331/36 C |
| 2015/0249429 A1 | 9/2015 | Habu |
| 2016/0285465 A1 | 9/2016 | Abe et al. |
| 2017/0054413 A1 | 2/2017 | Djahanshahi et al. |

* cited by examiner

DEVICE AND METHOD FOR ADAPTIVE LOOP GAIN OF OSCILLATOR

CROSS-REFERENCE TO RELATED APPLICATION

This application is based on and claims priority under 35 U.S.C. § 119 to Korean Patent Application No. 10-2023-0001939, filed on Jan. 5, 2023, in the Korean Intellectual Property Office, the disclosure of which is incorporated by reference herein in its entirety.

BACKGROUND

The inventive concepts relate to oscillators, and more particularly to devices and methods for adaptive loop gain of oscillators.

Oscillators for generating an oscillation signal may be used in various applications. For example, an oscillator may be used to generate oscillation signals used for the reception and transmission of wireless signals. Applications may require an oscillator improved for high performance and efficiency. For example, it may be required for the oscillator to have high operation reliability, low jitter of oscillation signals, reduced power consumption, and the like.

SUMMARY

Some example embodiments of the inventive concepts provide a device and/or a method for an oscillator providing high reliability and efficiency through an adaptive loop gain.

According to some example embodiments of the inventive concepts, a device may include an oscillator including at least one inductor and at least one capacitor and configured to generate, based on a positive supply voltage, an output signal oscillating in a resonance frequency of the at least one inductor and the at least one capacitor, and an oscillation detector configured to determine, based on a clock signal, whether the output signal oscillates and increase a loop gain of the oscillator until the output signal oscillates.

According to some example embodiments of the inventive concepts, a method of controlling an oscillator may include at least one inductor and at least one capacitor, the method including receiving an output signal oscillating in a resonance frequency of the at least one inductor and the at least one capacitor, the output signal being generated by the oscillator based on a positive supply voltage, determining whether the output signal oscillates based on a clock signal, and increasing a loop gain of the oscillator until the output signal oscillates.

According to some example embodiments of the inventive concepts, a device may include a phase detector configured to detect a phase difference between a clock signal and a feedback signal, a voltage generator configured to generate an input voltage based on the phase difference, an oscillator configured to generate an output signal with a frequency that is adjusted according to the input voltage, a frequency divider configured to generate the feedback signal by dividing the output signal, and a controller configured to determine whether the output signal oscillates and increase a loop gain of the oscillator until the output signal oscillates.

BRIEF DESCRIPTION OF THE DRAWINGS

Example embodiments will be more clearly understood from the following detailed description taken in conjunction with the accompanying drawings in which.

DETAILED DESCRIPTION

Figure 1:
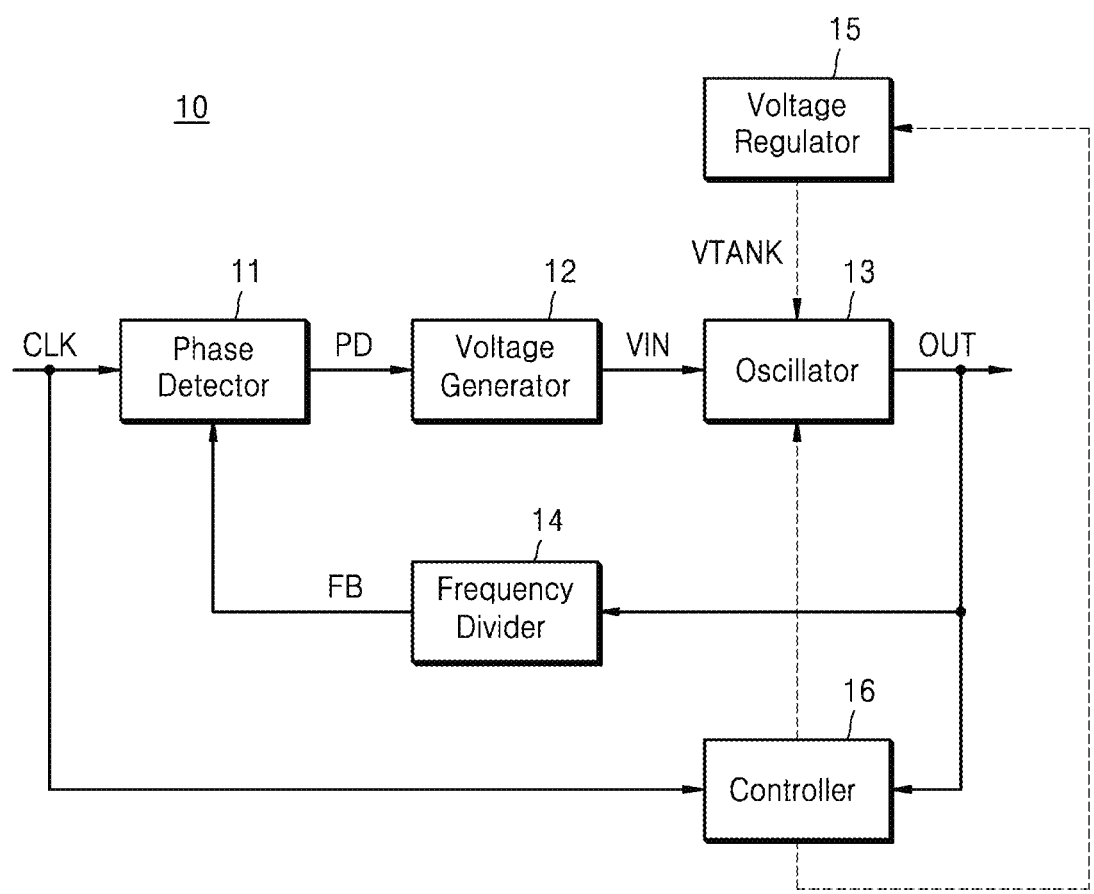
FIG. 1 is a block diagram of a device according to some example embodiments.

Hereinafter, some example embodiments of the inventive concepts are described in detail with reference to the accompanying drawings. Like drawing reference numerals are used for like elements, and duplicate descriptions thereof will be omitted.

Throughout the specification, when a part is "connected" to another part, it includes not only a case where the part is "directly connected" but also a case where the part is "indirectly connected" with another part in between. In addition, unless explicitly described to the contrary, the word "comprise" and variations such as "comprises" or "comprising" will be understood to imply the inclusion of stated elements but not the exclusion of any other elements.

The use of the term "the" and similar demonstratives may correspond to both the singular and the plural. Operations constituting methods may be performed in any suitable order unless otherwise indicated herein or otherwise clearly contradicted by context and are not necessarily limited to the stated order.

The use of all illustrations or illustrative terms in some example embodiments is simply to describe the technical ideas in detail, and the scope of the present inventive concepts is not limited by the illustrations or illustrative terms unless they are limited by claims.

As described herein, when an operation is described to be performed, or an effect such as a structure is described to be established "by" or "through" performing additional operations, it will be understood that the operation may be performed and/or the effect/structure may be established "based on" the additional operations, which may include performing said additional operations alone or in combination with other further additional operations.

FIG. 1 is a block diagram of a device 10 according to some example embodiments. In some example embodiments, components of the device 10 may be manufactured through semiconductor processes. For example, the components of the device 10 may be included in at least one chip (or die), and the at least one chip may be included in at least one semiconductor package. The device 10 may generate an output signal OUT based on a clock signal CLK, and the output signal OUT may be synchronized with the clock signal CLK and have a frequency multiplied from a frequency of the clock signal CLK. In some example embodiments, the clock signal CLK may have a fixed frequency like a crystal oscillator and may be referred to as a reference oscillation signal. In some example embodiments, the device 10 may be referred to as a Phase Locked Loop (PLL). As shown in FIG. 1, the device 10 may include a phase detector 11, a voltage generator 12, an oscillator 13, a frequency divider 14, a voltage regulator 15, and a controller 16. In some example embodiments, the controller 16 may be referred to herein interchangeably as an "oscillator detector."

The phase detector 11 may receive the clock signal CLK, receive a feedback signal FB from the frequency divider 14, and generate a phase difference signal PD. For example, the phase detector 11 may detect a phase difference between the clock signal CLK and the feedback signal FB and generate the phase difference signal PD corresponding to the detected phase difference. In some example embodiments, the phase difference signal PD may include an up signal and a down signal, wherein the up signal is activated when (e.g., in response to a determination that) the phase of the feedback signal FB lags behind the phase of the clock signal CLK, and the down signal is activated when (e.g., in response to a determination that) the phase of the feedback signal FB leads the phase of the clock signal CLK. In some example embodiments, the phase detector 11 may include a plurality of logic gates and may be referred to as a phase frequency detector.

The voltage generator 12 may receive the phase difference signal PD from the phase detector 11 and generate an input voltage VIN. For example, the voltage generator 12 may generate the input voltage VIN having a magnitude corresponding to the phase difference indicated by the phase difference signal PD. In some example embodiments, the voltage generator 12 may include a charge pump and a Low Pass Filter (LPF). The charge pump may receive the phase difference signal PD including the up signal and the down signal. The charge pump may provide electric charges to the LPF in response to the activated up signal and may draw the electric charges from the LPF in response to the activated down signal. Accordingly, an input voltage VIN generated by the LPF may have a magnitude corresponding to the phase difference between the clock signal CLK and the feedback signal FB.

The oscillator 13 may receive the input voltage VIN from the voltage generator 12 and a positive supply voltage VTANK from the voltage regulator 15 and may generate the output signal OUT. The oscillator 13 may generate the output signal OUT with a frequency corresponding to the magnitude of the input voltage VIN, based on power supplied from the positive supply voltage VTANK. Herein, the output signal OUT may be referred to as an oscillation signal. The frequency of the output signal OUT required in a system, e.g., a communication system, which includes the device 10, may increase, and accordingly, the low jitter of the output signal OUT may be significant. In some example embodiments, as described below with reference to FIGS. 2A to 2C, the oscillator 13 may include an inductor and a capacitor and may generate an output signal OUT having a resonance frequency of the inductor and the capacitor (e.g., an oscillator oscillating in a resonance frequency of the inductor and the capacitor). Accordingly, the oscillator 13 may generate an output signal OUT with low jitter. Herein, the oscillator 13 may be referred to as a Voltage Controlled Oscillator (VCO) and, specifically, the oscillator 13 using the resonance frequency of the inductor and the capacitor may be referred to as an LC VCO.

The oscillator 13 as an LC VCO may generate an oscillation signal when (e.g., in response a determination that) a loop gain is greater than or equal to 1. The oscillator 13 designed to have a loop gain of 1 or greater may have a loop gain of less than 1, based on various variations. For example, the loop gain of the oscillator 13 may change according to a process voltage temperature (PVT) variation, and when the changed loop gain is less than 1, the oscillator 13 may not generate the output signal OUT that oscillates. When the output signal OUT does not oscillate, errors may occur in the system including the device 10, and the system may malfunction. Because the LC VCO may consume power in proportion to the loop gain, when the oscillator 13 having a loop gain with a sufficient margin is designed to generate the output signal OUT that oscillates, the oscillator 13 may consume a large amount of power, and accordingly, the power efficiency of the system including the device 10 may degrade.

The frequency divider 14 may receive the output signal OUT from the oscillator 13 and generate the feedback signal FB by dividing the output signal OUT. For example, the frequency divider 14 may divide the output signal OUT based on a preset division ratio of 1/N, and thus, the output signal OUT may have a frequency that is N times the frequency of the clock signal CLK. In some example embodiments, the frequency divider 14 may be omitted, and the output signal OUT may be provided to the phase detector 11 as the feedback signal FB (that is, N=1).

The controller 16 may receive the clock signal CLK and may receive the output signal OUT from the oscillator 13. The controller 16 may determine, based on the clock signal CLK, whether the output signal OUT oscillates and may increase the loop gain of the oscillator 13 until the output signal OUT oscillates (e.g., until the controller 16 determines that the output signal OUT oscillates, such that the controller 16 may cease increasing the loop gain of the oscillator 13 in response to a determination that the output signal OUT oscillates). Restated, the controller 16 may iteratively (1) determine, based on the clock signal CLK, whether the output signal OUT oscillates and (2) in response to a determination that the output signal OUT does not oscillate, increase the loop gain of the oscillator 13, where the iterative performance of (1) and (2) is performed until, in response to a determination that the output signal OUT oscillates, the loop gain of the oscillator 13 is ceased to be further increased. In some example embodiments, the controller 16 may control the voltage regulator 15 to increase the loop gain, as indicated by the dashed line in FIG. 1. In some example embodiments, the controller 16 may control the oscillator 13 to increase the loop gain, as indicated by the dashed line in FIG. 1. Accordingly, despite various variations, the oscillator 13 may generate the output signal OUT that oscillates, and errors and malfunction of the system including the device 10 may be reduced, minimized, or prevented based on reducing, minimizing, or preventing the frequency of occurrences where the output signal OUT does not oscillate. That is, the high reliability of the oscillator 13 or the device 10 may be achieved based on reducing, minimizing, or preventing the frequency of occurrences where the output signal OUT does not oscillate. Also, an optimum loop gain corresponding to minimum power consumption may be detected and/or determined by the controller 16 based on performing the control referred to herein, and the efficiency of the device 10 and the system may increase (e.g., power consumption by the device 10 to cause an output signal OUT that oscillates to be output may be reduced or minimized). For example, based on the controller 16 causing the loop gain of the oscillator 13 to be increased until the output signal OUT is determined to oscillate, in response to which the loop gain of the oscillator 13 is ceased to be further increased, the loop gain may be increased to a minimum level, value, or the like which causes the output signal OUT to oscillate, thereby reducing or minimizing the power consumption of the device to cause the output signal OUT to oscillate. Also, the output signal OUT with a high frequency and low jitter may be stably generated based on the controller 16 performing the control referred to herein, and thus, the performance of the device 10 and the system may be improved based on the controller 16 causing the device 10 to generate stable output signals OUT having high frequency and low jitter. Herein, the controller 16 may be referred to as a calibration circuit, an oscillation detector, or the like. Examples of the controller 16 are described with reference to FIGS. 3 and 7.

Figure 2A:
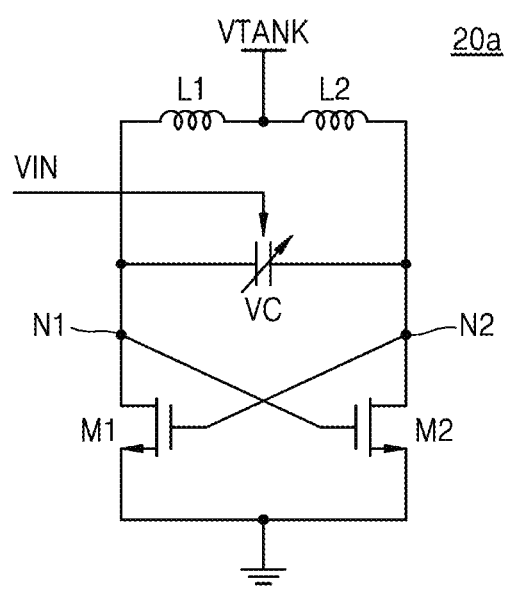
FIGS. 2A, 2B, and 2C are circuit diagrams of examples of an oscillator, according to some example embodiments.
Figure 2B:
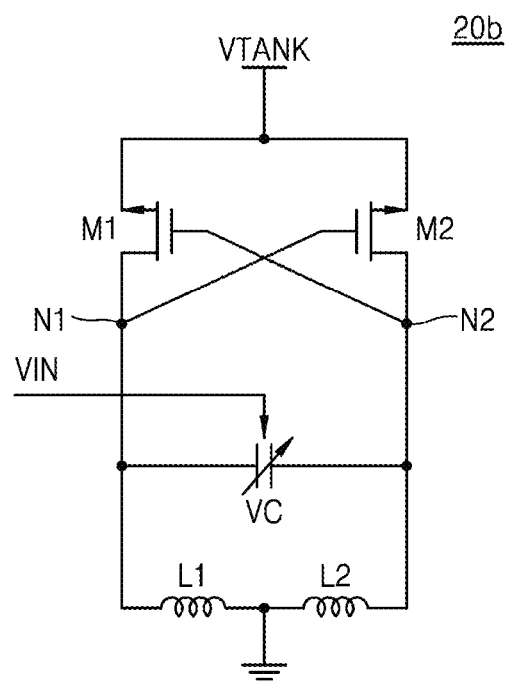
Figure 2C:
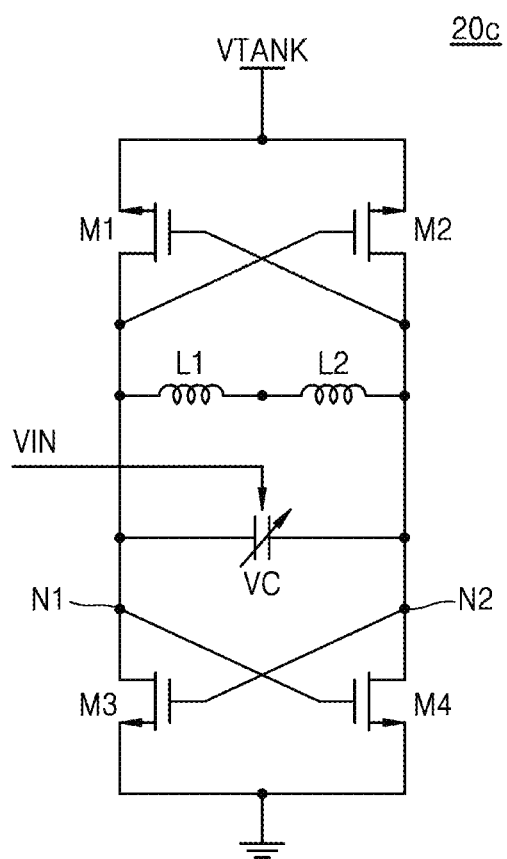

FIGS. 2A, 2B, and 2C are circuit diagrams of examples of an oscillator, according to some example embodiments. For example, the circuit diagrams of FIGS. 2A to 2C are examples of the oscillator 13 of FIG. 1 and respectively show LC VCOs 20a, 20b, and 20c. The oscillator 13 of FIG. 1 is not limited to the LC VCOs 20a, 20b, and 20c of FIGS. 2A to 2C. Hereinafter, descriptions that are the same as those given above are omitted from the descriptions of FIGS. 2A to 2C.

Referring to FIG. 2A, the LC VCO 20a may include a first inductor L1, a second inductor L2, a variable capacitor VC, a first transistor M1, and a second transistor M2. The first inductor L1 and the second inductor L2 may be connected in series between a first node N1 and a second node N2, and a positive supply voltage VTANK may be applied to a node to which the first inductor L1 and the second inductor L2 are connected. The variable capacitor VC may be connected between the first node N1 and the second node N2 and thus may be connected to the first inductor L1 and the second inductor L2 in parallel, wherein the first inductor L1 and the second inductor L2 are connected in series. The variable capacitor VC may receive the input voltage VIN, and capacitance adjusted according to the input voltage VIN may be provided between the first node N1 and the second node N2. In some example embodiments, the variable capacitor VC may include a varactor, and the input voltage VIN may be used as a control voltage of the varactor. Accordingly, based on the capacitance changing according to the input voltage VIN, the resonance frequency may change, and the oscillation signal (e.g., the output signal OUT of FIG. 1) having the resonance frequency may be generated between the first node N1 and the second node N2.

The first transistor M1 may include a drain connected to the first node N1, a source connected to a ground potential node (or a negative supply voltage node), and a gate connected to the second node N2. The second transistor M2 may include a drain connected to the second node N2, a source connected to the ground potential node, and a gate connected to the first node N1. As shown in FIG. 2A, each of the first transistor M1 and the second transistor M2 may be an n-channel field effect transistor (NFET). The first transistor M1 and the second transistor M2, which are commonly connected to the ground potential node and in which the gates and the drains are cross-coupled, may form a negative GM cell.

As described above with reference to FIG. 1, when the LC VCO 20a has a loop gain that is greater than or equal to 1, an oscillating signal may be generated. A loop gain G of the LC VCO 20a may be calculated according to [Equation 1] below.

$$G = 2*GM*Rp \qquad \text{[Equation 1]}$$

In [Equation 1], GM may be transconductance of a transistor, Rp may be resistance of an inductor, and 2 may indicate a differential mode. It may be required to increase GM and/or Rp to increase the loop gain G. Because the inductor depends on a structure manufactured through semiconductor processes, the loop gain may increase by increasing GM, that is, the transconductance. When a supply voltage applied to an LC tank, that is, the positive supply voltage VTANK, increases, or when sizes (that is, channel widths) of the first transistor M1 and the second transistor M2 increase, the transconductance may increase. Accordingly, as described below with reference to the drawings, the controller 16 of FIG. 1 may adjust the loop gain of the oscillator 13 by adjusting the positive supply voltage VTANK or the effective size of the transistor.

Referring to FIG. 2B, the LC VCO 20b may include the first transistor M1, the second transistor M2, the variable capacitor VC, the first inductor L1, and the second inductor L2. The first transistor M1 may include the drain connected to the first node N1, the source connected to the positive supply voltage node, and the gate connected to the second node N2. The second transistor M2 may include the drain connected to the second node N2, the source connected to the positive supply voltage node, and the gate connected to the first node N1. As shown in FIG. 2B, each of the first transistor M1 and the second transistor M2 may be a p-channel field effect transistor (PFET). The first transistor M1 and the second transistor M2, which are commonly connected to a positive supply voltage potential node and in which the gates and drains are cross-coupled, may form a negative GM cell.

The variable capacitor VC may be connected between the first node N1 and the second node N2. The variable capacitor VC may receive the input voltage VIN and provide capacitance, which is adjusted according to the input voltage VIN, between the first node N1 and the second node N2. The first inductor L1 and the second inductor L2 may be connected to each other in series between the first node N1 and the second node N2, and a ground potential (or a negative supply voltage) may be applied to a node to which the first inductor L1 and the second inductor L2 are connected.

Referring to FIG. 2C, the LC VCO 20c may include a first transistor M1 to a fourth transistor M4, the first inductor L1, the second inductor L2, and the variable capacitor VC. The first transistor M1 may include the drain connected to the first node N1, the source connected to the positive supply voltage node, and the gate connected to the second node N2. The second transistor M2 may include the drain connected to the second node N2, the source connected to the positive supply voltage node, and the gate connected to the first node N1. As shown in FIG. 2C, each of the first transistor M1 and the second transistor M2 may be a PFET. The third transistor M3 may include a drain connected to the first node N1, a source connected to a ground node, and a gate connected to the second node N2. The fourth transistor M4 may include a drain connected to the second node N2, a source connected to the ground node, and a gate connected to the first node N1. As shown in FIG. 2C, each of the third transistor M3 and the fourth transistor M4 may be a NFET. As described above with reference to FIGS. 2A and 2B, the first transistor M1 to the fourth transistor M4 may form a negative GM cell.

The first inductor L1 and the second inductor L2 may be connected to each other in series between the first node N1 and the second node N2. In some example embodiments, the first inductor L1 and the second inductor L2 may be implemented as a single inductor. The variable capacitor VC may be connected between the first node N1 and the second node N2. The variable capacitor VC may receive the input voltage VIN and provide capacitance, which is adjusted according to the input voltage VIN, between the first node N1 and the second node N2.

The FET (e.g., each of the transistors as described herein) may have one of various structures. For example, the FET may include a fin field effect transistor (FinFET), a gate-all-around field effect transistor (GAAFET), a multi-bridge channel field effect transistor (MBCFET), a vertical field effect transistor (VFET), a fork field effect transistor (ForkFET), a complementary field effect transistor (CFET), a negative capacitance field effect transistor (NCFET), a carbon nanotube (CNT) FET, or the like. Hereinafter, the LC VCO 20a of FIG. 2A is mainly referred to, but some example embodiments are not limited thereto.

Figure 3:
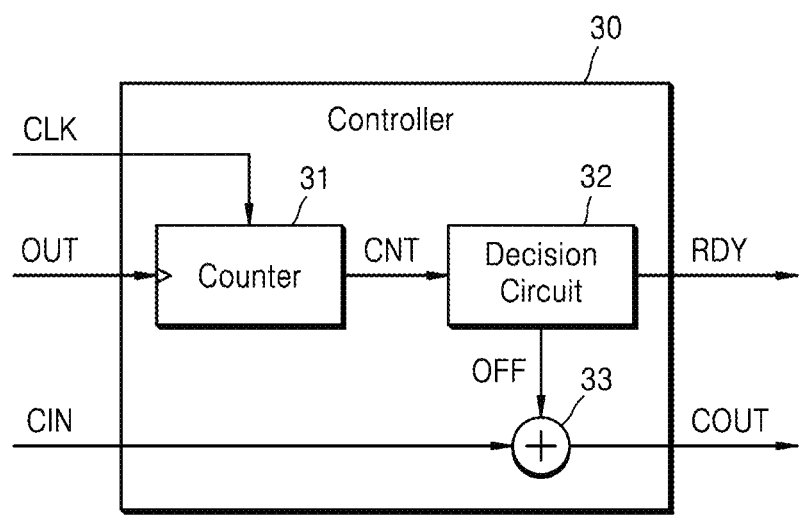
FIG. 3 is a block diagram of a controller according to some example embodiments.

FIG. 3 is a block diagram of the controller 30 according to some example embodiments. As described above with reference to FIG. 1, the controller 30 may determine, based on the clock signal CLK, whether the output signal OUT oscillates and may adjust the loop gain of the oscillator 13 of FIG. 1. As shown in FIG. 3, the controller 30 may include a counter 31, a decision circuit 32, and an adder 33. Hereinafter, the diagram of FIG. 3 is described with reference to FIG. 1.

The counter 31 may receive the clock signal CLK and the output signal OUT and generate a count signal CNT. The counter 31 may count transitions of the output signal OUT and generate the count signal CNT corresponding to a count value. A transition may refer to a transition of the output signal between a high signal value and a low signal value, a transition of the output signal between a low signal value and a high signal value, a cycle of the output signal between a low signal value and a high signal value, or a cycle of the output signal between a high signal value and a low signal value. In some example embodiments, the counter 31 may reset the count signal CNT in response to the clock signal CLK. For example, the counter 31 may reset the count signal CNT in each cycle of the clock signal CLK. In some example embodiments, the counter 31 may generate a signal divided from the clock signal CLK to be a divided signal and reset the count signal CNT in every cycle of the divided signal. Accordingly, the count signal CNT may indicate the number (e.g., quantity) of transitions of the output signal OUT in a certain period, for example, a period corresponding to a cycle of the clock signal CLK or a multiple of the cycle, and may indicate the frequency of the output signal OUT.

The decision circuit 32 may receive the count signal CNT from the counter 31 and generate an offset signal OFF and a ready signal RDY. As described above, the count signal CNT may indicate the frequency of the output signal OUT, and the decision circuit 32 may identify the frequency of the output signal OUT based on the count signal CNT. The decision circuit 32 may compare the frequency of the output signal OUT with a reference frequency, and when the frequency of the output signal OUT is greater than or equal to the reference frequency, it may be determined (e.g., by the decision circuit 32) that the output signal OUT oscillates. For example, the decision circuit 32 may compare a value of the count signal CNT with a reference value, and when (e.g., in response to a determination that) the value of the count signal CNT is greater than or equal to the reference value, it may be determined (e.g., by the decision circuit 32) that the output signal OUT oscillates. The reference frequency or the reference value may be set in advance based on a structure of the oscillator 13.

The decision circuit 32 may generate an activated ready signal RDY when it is determined (e.g., in response to a determination) that the output signal OUT oscillates and generate a deactivated ready signal RDY when it is determined (e.g., in response to a determination) that the output signal OUT does not oscillate. In some example embodiments, the device 10 may activate a feedback loop in response to the activated ready signal RDY and may operate such that the phase of the output signal OUT may be locked to that of the clock signal CLK.

The decision circuit 32 may increase the loop gain of the oscillator 13 when (e.g., in response to a determination that) the value of the count signal CNT is less than the reference value, that is, when the frequency of the output signal OUT is less than the reference frequency. To this end, the decision circuit 32 may generate a control signal COUT (herein, it may be referred to as an output control signal) for controlling the loop gain of the oscillator 13 and may generate the control signal COUT to increase the loop gain until the frequency of the output signal OUT reaches the reference frequency. For example, as described below with reference to FIG. 4, the control signal COUT may be provided to the voltage regulator 15, and the decision circuit 32 may generate the control signal COUT to increase the positive supply voltage VTANK. Also, as described below with reference to FIGS. 6A and 6B, the decision circuit 32 may generate the control signal COUT to increase the effective size of a transistor included in the oscillator 13.

In some example embodiments, the decision circuit 32 may collect values of the count signal CNT and determine, based on the collected values, whether the output signal OUT oscillates. For example, the decision circuit 32 may collect values of the count signal CNT, which respectively correspond to a plurality of periods, and calculate an average of the collected values. When (e.g., in response to a determination that) the average is greater than or equal to the reference value, the decision circuit 32 may determine that the output signal OUT oscillates, but when the average is less than the reference value, the decision circuit 32 may determine that the output signal OUT does not oscillate.

The controller 30 may receive an input control signal CIN and generate the control signal COUT that gradually increases from the input control signal CIN. For example, as shown in FIG. 3, the adder 33 may receive the input control signal CIN and an offset signal OFF and generate the control signal COUT by adding the input control signal CIN to the offset signal OFF. In some example embodiments, the input control signal CIN may be provided from the outside of the device 10 including the controller 30 and may have a value corresponding to an initial loop gain for detecting an optimum loop gain.

The decision circuit 32 may generate the offset signal OFF, which gradually increases (e.g., from zero) over time, and thus, the control signal COUT may gradually increase (e.g., increase in magnitude) over time. In some example embodiments, the control signal COUT may be a multi-bit signal, and the value of the control signal COUT may gradually increase over time. In some example embodiments, the control signal COUT may have a value encoded based on unary coding or thermometer code and thus have a value in which the number (e.g., quantity) of 1s (or zeros) gradually increases over time. In some example embodiments, unlike the illustration of FIG. 3, the adder 33 may be omitted from the controller 30, and the decision circuit 32 may directly generate the control signal COUT without generating the offset signal OFF. In some example embodiments, the decision circuit 32 may receive the clock signal CLK or a signal divided from the clock signal CLK by the counter 31 and operate in synchronization with the received signal.

Figure 4:
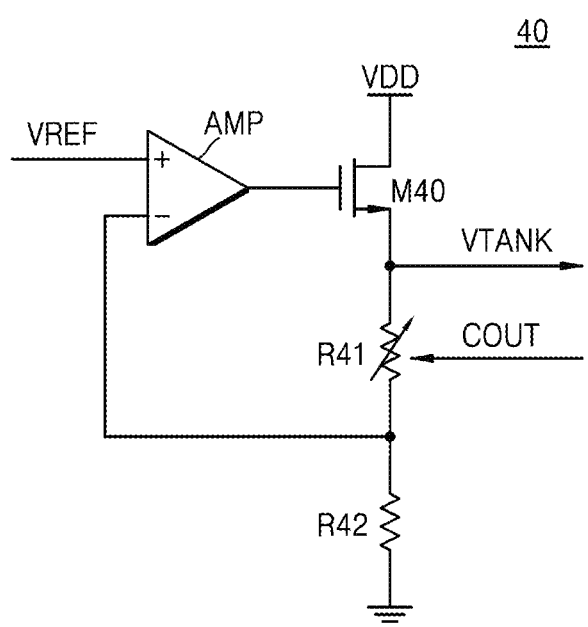
FIG. 4 is a circuit diagram of a voltage regulator according to some example embodiments.

FIG. 4 is a circuit diagram of a voltage regulator 40 according to some example embodiments. As described above with reference to the drawings, the voltage regulator 40 may generate the positive supply voltage VTANK and provide the positive supply voltage VTANK to the oscillator 13 of FIG. 1. In some example embodiments, the controller 30 of FIG. 3 may generate the control signal COUT to increase the positive supply voltage VTANK so as to increase the loop gain of the oscillator 13 of FIG. 1. It is noted that the voltage regulator 15 of FIG. 1 is not limited to the voltage regulator 40 of FIG. 4. Hereinafter, the circuit diagram of FIG. 4 is described with reference to FIGS. 1 and 3.

Referring to FIG. 4, the voltage regulator 40 may include an amplifier AMP, a transistor M40, a first resistor R41, and a second resistor R42. The amplifier AMP may have a non-inverting input receiving a reference voltage VREF and an inverting input connected to the first resistor R41 and the second resistor R42 and have an output connected to a gate of the transistor M40. The transistor M40 may be an NFET, and as shown in FIG. 4, the transistor M40 may include a drain to which the supply voltage VDD is applied, a gate to which an output voltage of the amplifier AMP is applied, and a source connected to the first resistor R41.

The first resistor R41 may be connected between the transistor M40 and the second resistor R42, and the second resistor R42 may be connected between the first resistor R41 and a ground potential node. As shown in FIG. 4, the first resistor R41 may be a variable resistor and have a resistance adjusted (e.g., may be configured to adjust the resistance of the first resistor R41) according to the control signal COUT. For example, the first resistor R41 may include resistors connected to each other in parallel and switches respectively connected to the resistors in series, and the switches may be turned on or off in response to the control signal COUT.

As shown in FIG. 4, a voltage of the source of the transistor M40 may be output as the positive supply voltage VTANK. When the amplifier AMP is an ideal operational amplifier, the positive supply voltage VTANK may be calculated according to [Equation 2].

$$VTANK = VREF \left(1 + \frac{R_{41}}{R_{42}}\right) \quad \text{[Equation 2]}$$

In [Equation 2], $R_{41}$ may be a resistance of the first resistor R41, and $R_{42}$ may be a resistance of the second resistor R42. As described above, because the resistance $R_{41}$ of the first resistor R41 may be adjusted according to the control signal COUT, the positive supply voltage VTANK may be adjusted according to the control signal COUT.

Figure 5:
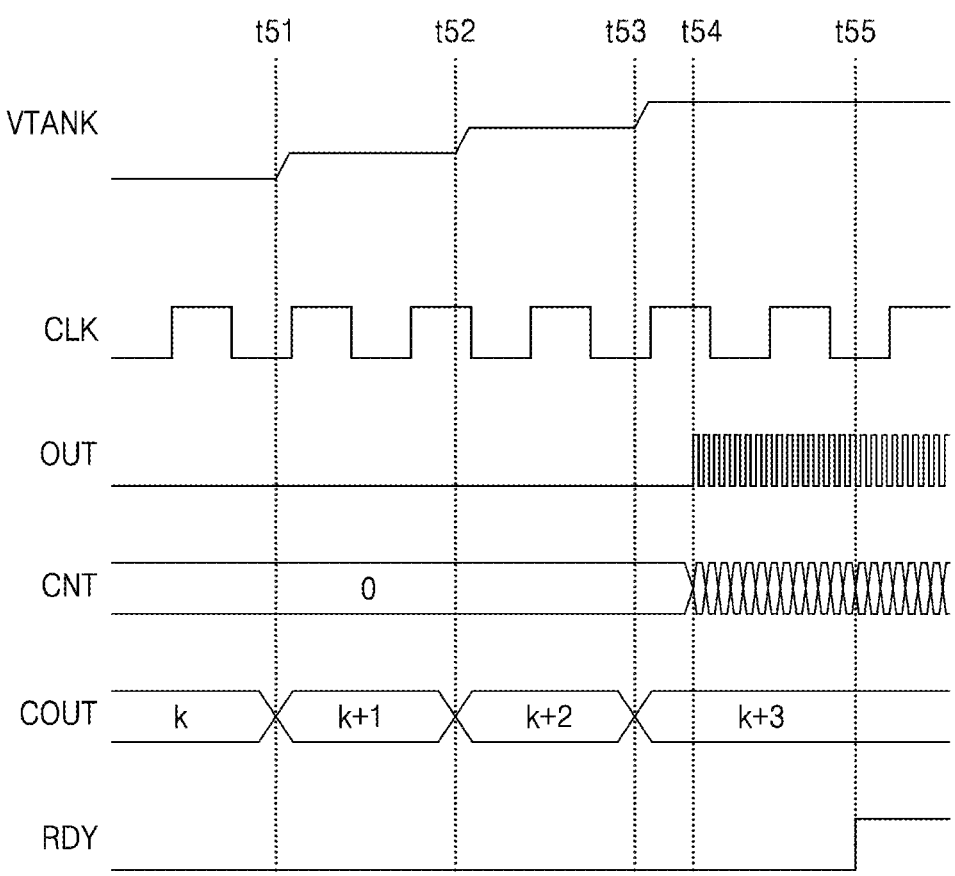
FIG. 5 is a timing diagram of an operation of detecting an optimum loop gain, according to some example embodiments.

FIG. 5 is a timing diagram of an operation of detecting an optimum loop gain, according to some example embodiments. For example, the timing diagram of FIG. 5 shows signals of FIG. 3 over time. In FIG. 5, a ready signal RDY may be an active high signal. Hereinafter, the timing diagram of FIG. 5 is described with reference to FIGS. 1 and 4.

Referring to FIG. 5, at time t51, a value of the control signal COUT may increase from k to k+1. For example, as shown in FIG. 5, the transition of the output signal OUT may not occur until the time t51, and thus, the count signal CNT may have a value of 0. That is, at the time t51, the loop gain corresponding to the positive supply voltage VTANK may be less than 1. The decision circuit 32 may compare 0, which is the value of the count signal CNT, with the reference value, determine that the output signal OUT does not oscillate, and increase the value of the control signal COUT by 1. In some example embodiments, k may correspond to a value (e.g., magnitude) of the input control signal CIN. In some example embodiments, unlike the diagram of FIG. 5, the decision circuit 32 may increase the value of the control signal COUT by an arbitrary positive value other than 1. In response to the control signal COUT with the increased value, the voltage regulator 15 may increase the positive supply voltage VTANK as shown in FIG. 5, and the increased positive supply voltage VTANK may be applied to the oscillator 13.

At time t52, the value of the control signal COUT may increase from k+1 to k+2. For example, as shown in FIG. 5, the transition of the output signal OUT may not occur until the time t52, and thus, the count signal CNT may have a value of 0. That is, at the time t52, the loop gain corresponding to the positive supply voltage VTANK may be less than 1. The decision circuit 32 may compare 0, which is the value of the count signal CNT, with the reference value, determine that the output signal OUT does not oscillate, and increase the value of the control signal COUT by 1. In response to the control signal COUT with the increased value, the voltage regulator 15 may increase the positive supply voltage VTANK as shown in FIG. 5, and the increased positive supply voltage VTANK may be applied to the oscillator 13.

At time t53, the value of the control signal COUT may increase from k+2 to k+3. For example, as shown in FIG. 5, the transition of the output signal OUT may not occur until the time t53, and thus, the count signal CNT may have a value of 0. That is, at the time t53, the loop gain corresponding to the positive supply voltage VTANK may be less than 1. The decision circuit 32 may compare 0, which is the value of the count signal CNT, with a reference value, determine that the output signal OUT does not oscillate, and increase the value of the control signal COUT by 1. In response to the control signal COUT with the increased value, the voltage regulator 15 may increase the positive supply voltage VTANK as shown in FIG. 5, and the increased positive supply voltage VTANK may be applied to the oscillator 13.

At time t54, the transition of the output signal OUT may occur. For example, at the time t54, the loop gain corresponding to the positive supply voltage VTANK may be greater than or equal to 1, and thus, the oscillator 13 may generate the output signal OUT that oscillates. Accordingly, as shown in FIG. 5, the value of the count signal CNT may increase.

At time t55, the ready signal RDY may be activated. For example, the decision circuit 32 may compare the value of the count signal CNT with the reference value and identify the value of the count signal CNT, which is greater than the reference value. Accordingly, the decision circuit 32 may determine that the output signal OUT oscillates, maintain the value of the control signal COUT (e.g., cease increasing the value of the control signal and thus cease further increases in the loop gain of the oscillator 13), and generate the activated ready signal RDY. In some example embodiments, the ready signal RDY may be provided to the counter 31, and the counter 31 may stop counting in response to the activated ready signal RDY. Accordingly, while the loop gain is greater than or equal to 1, the power consumption by the counter 31 may be reduced, minimized, or prevented (e.g., based on causing the counter 31 to stop counting, such that further increases in the loop gain may be precluded, in response to the determination that the output signal OUT oscillates). Furthermore, because the loop gain is caused to cease further increases in response to the determination that the output signal OUT oscillates, the loop gain may be held at a minimum level, value, magnitude, etc. which causes the output signal OUT to oscillate, thereby optimizing (e.g., reducing or minimizing) power consumption by the oscillator, the voltage regulator, or the like to cause the output signal OUT to oscillate, and thereby optimizing (e.g., reducing or minimizing) power consumption by a device 10 that includes the optimizer, the controller, and the like.

In some example embodiments, the operation described with reference to FIG. 5 may be performed when the operation of the device 10 of FIG. 1 is initiated. For example, when power is supplied to the system including the device 10, the device 10 may perform the operation of FIG. 5. Accordingly, the optimum loop gain, that is, a loop gain corresponding to minimum power consumption (e.g., a minimum loop gain that causes the output signal OUT to oscillate), may be detected in a current state of the device 10, and the oscillator 1 may be controlled to have the optimum loop gain.

Figure 6A:
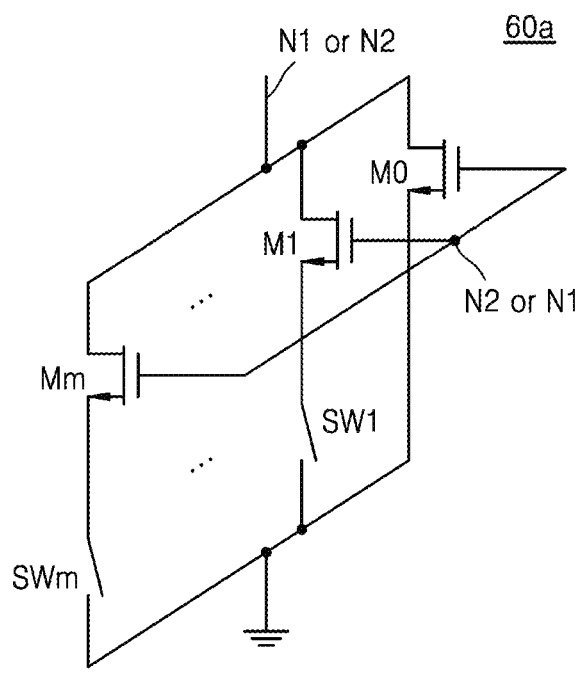
FIGS. 6A and 6B are circuit diagrams of examples of transistors included in an oscillator, according to some example embodiments.
Figure 6B:
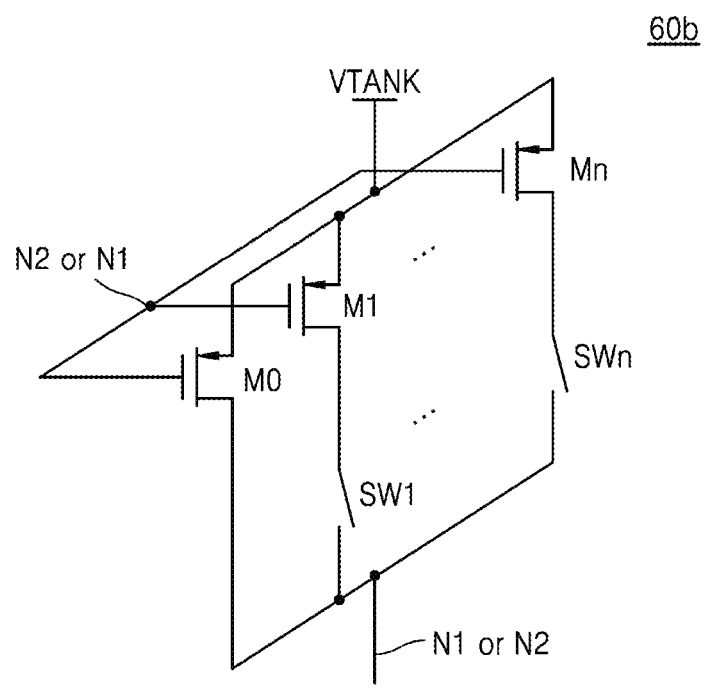

FIGS. 6A and 6B are circuit diagrams of examples of transistors included in an oscillator, according to some example embodiments. As described above with reference to FIGS. 2A to 2C, the oscillator may include transistors forming the negative GM cell. In some example embodiments, the controller 30 of FIG. 3 may generate the control signal COUT to increase effective sizes of the transistors included in the oscillator 13 so as to increase the loop gain of the oscillator 13 of FIG. 1. The transistors included in the oscillator are not limited to the transistors shown in FIGS. 6A and 6B. Hereinafter, the circuit diagrams of FIGS. 6A and 6B are described with reference to FIGS. 1 to 3.

Referring to FIG. 6A, an oscillator 60a may include a plurality of transistors that are connected to each other in parallel between the first node N1 (or the second node N2) and the ground potential node. For example, as shown in FIG. 6A, the oscillator 60a may include an NFET M0 and a first NFET M1 to an $m^{th}$ NFET Mm (where, m is an integer greater than 0), and the NFET M0 and the first NFET M1 to the $m^{th}$ NFET Mm may be connected to each other in parallel between the first node N1 (or the second node N2) and the ground potential node. Gates of the NFET M0 and the first NFET M1 to the $m^{th}$ NFET Mm may be commonly connected to the second node N2 (or the first node N1). In some example embodiments, the circuit of FIG. 6A may correspond to one NFET shown in FIGS. 2A and 2C. As shown in FIG. 6A, the NFET M0 may be directly connected to the first node N1 (or the second node N2) and the ground potential node, respectively.

The oscillator 60a may include a first switch SW1 to an $m^{th}$ switch SWm controlled according to the control signal COUT, and the first switch SW1 to the $m^{th}$ switch SWm may be connected in series to the first NFET M1 to the $m^{th}$ NFET Mm, respectively. In some example embodiments, each of the first switch SW1 to the $m^{th}$ switch SWm may be an NFET having a gate receiving one bit signal of the control signal COUT. Each of the first switch SW1 to the $m^{th}$ switch SWm may be turned on in response to an activated bit signal (e.g., having a high level) of the control signal COUT and may be turned off in response to a deactivated bit signal (e.g., having a low level) of the control signal COUT. Accordingly, the number of NFETs connected in parallel between the first node N1 (or the second node N2) and the ground potential node, that is, the effective sizes of the NFETs, may be adjusted according to the control signal COUT. As described above, to increase the loop gain, the controller 30 may generate the control signal COUT to increase the number of NFETs that are connected to each other in parallel.

Referring to FIG. 6B, an oscillator 60b may include a plurality of transistors connected to each other in parallel between a positive supply voltage node and the first node N1 (or the second node N2). For example, as shown in FIG. 6B, the oscillator 60b may include a PFET M0 and a first PFET M1 to an $n^{th}$ PFET Mn (where, n is an integer greater than 0), and the PFET M0 and the first PFET M1 to the $n^{th}$ PFET Mn may be connected to each other in parallel between the positive supply voltage node and the first node N1 (or the second node N2). Gates of the PFET M0 and the first PFET M1 to the $n^{th}$ PFET Mn may be commonly connected to the second node N2 (or the first node N1). In some example embodiments, the circuit of FIG. 6B may correspond to one PFET shown in FIGS. 2B and 2C. As shown in FIG. 6B, the PFET M0 may be directly connected to the positive supply voltage node and the first node N1 (or the second node N2), respectively.

The oscillator 60b may include a first switch SW1 to an $n^{th}$ switch SWn controlled according to the control signal COUT, and the first switch SW1 to the $n^{th}$ switch SWn may be connected in series to the first PFET M1 to the $n^{th}$ PFET Mm, respectively. In some example embodiments, each of the first switch SW1 to the $n^{th}$ switch SWn may be a PFET having a gate receiving one bit signal of the control signal COUT. Each of the first switch SW1 to the $n^{th}$ switch SWm may be turned on in response to an activated bit signal (e.g., having a low level) of the control signal COUT and may be turned off in response to a deactivated bit signal (e.g., having a high level) of the control signal COUT. Accordingly, the number of PFETs connected in parallel between the first node N1 (or the second node N2) and the positive supply voltage node, that is, the effective sizes of the PFETs, may be adjusted according to the control signal COUT. As described above, the controller 30 may generate the control signal COUT to increase the number of PFETs that are connected to each other in parallel to increase the loop gain.

Figure 7:
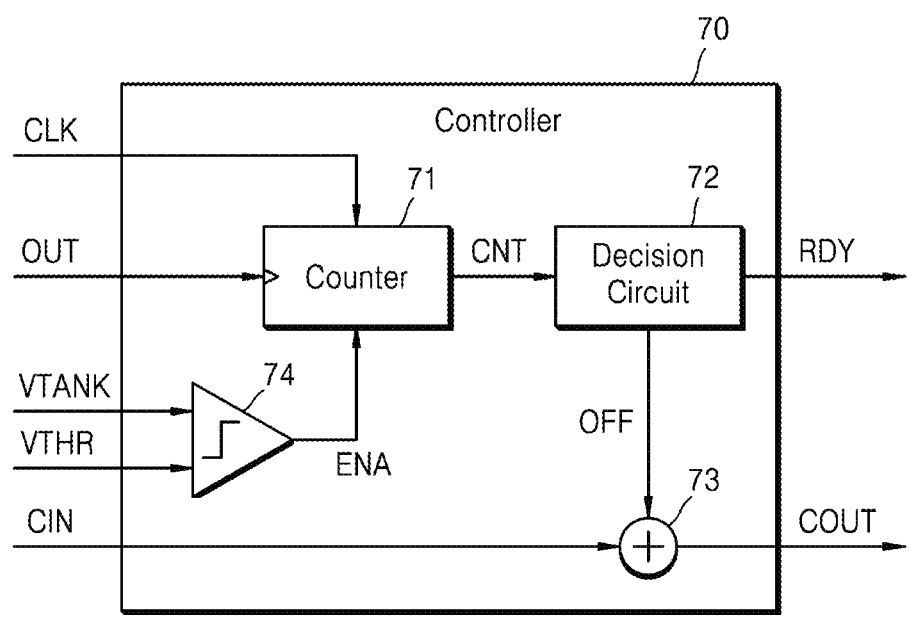
FIG. 7 is a block diagram of a controller according to some example embodiments.

FIG. 7 is a block diagram of a controller 70 according to some example embodiments. As described above with reference to FIG. 1, the controller 70 may determine, based on the clock signal CLK, whether the output signal OUT oscillates and may adjust the loop gain of the oscillator 13 of FIG. 1. As shown in FIG. 7, the controller 70 may include a counter 71, a decision circuit 72, an adder 73, and a comparator 74. Compared to the controller 30 of FIG. 3, the controller 70 of FIG. 7 may further include the comparator 74. Hereinafter, the diagram of FIG. 7 is described with reference to FIG. 1, and descriptions that are the same as the descriptions of FIG. 3 are omitted from the descriptions of FIG. 7.

The counter 71 may receive a clock signal CLK, an output signal OUT, and an enable signal ENA and generate a count signal CNT. The counter 71 may count transition of the output signal OUT in response to an activated enable signal ENA and reset the count signal CNT in response to a deactivated enable signal ENA. That is, the counter 71 may count the transition of the output signal OUT while the enable signal ENA is activated.

The decision circuit 72 may receive the count signal CNT and generate a ready signal RDY by determining, based on the count signal CNT, whether the output signal OUT oscillates. Also, the decision circuit 72 may provide an offset signal OFF to the adder 73, and the adder 73 may add an input control signal CIN to the offset signal OFF and thus generate a control signal COUT.

The comparator 74 may receive a positive supply voltage VTANK and a threshold voltage VTHR and compare the positive supply voltage VTANK with the threshold voltage VTHR, thus generating the enable signal ENA. For example, the comparator 74 may generate the activated enable signal ENA when (e.g., in response to a determination that) the positive supply voltage VTANK is greater than or equal to the threshold voltage VTHR, and may generate the deactivated enable signal ENA when ((e.g., in response to a determination that) the positive supply voltage VTANK is less than the threshold voltage VTHR.

As described below with reference to FIG. 8, an operation of detecting whether the output signal OUT oscillates may be initiated after the positive supply voltage VTANK, which is greater than or equal to the threshold voltage VTHR, is applied to the oscillator 13. For example, when power starts being supplied to the device 10 of FIG. 1, at the positive supply voltage VTANK that is less than the threshold voltage VTHR, the oscillator 13 may not normally operate, and the output signal OUT may include noise. Accordingly, an operation of detecting whether the output signal OUT oscillates may be initiated after a stable positive supply voltage VTANK, that is, the positive supply voltage VTANK that is greater than or equal to the threshold voltage VTHR, is applied to the oscillator 13 by the voltage regulator 15. The magnitude of the threshold voltage VTHR may be defined in advance based on a structure of the oscillator 13 and/or the voltage regulator 15.

Figure 8:
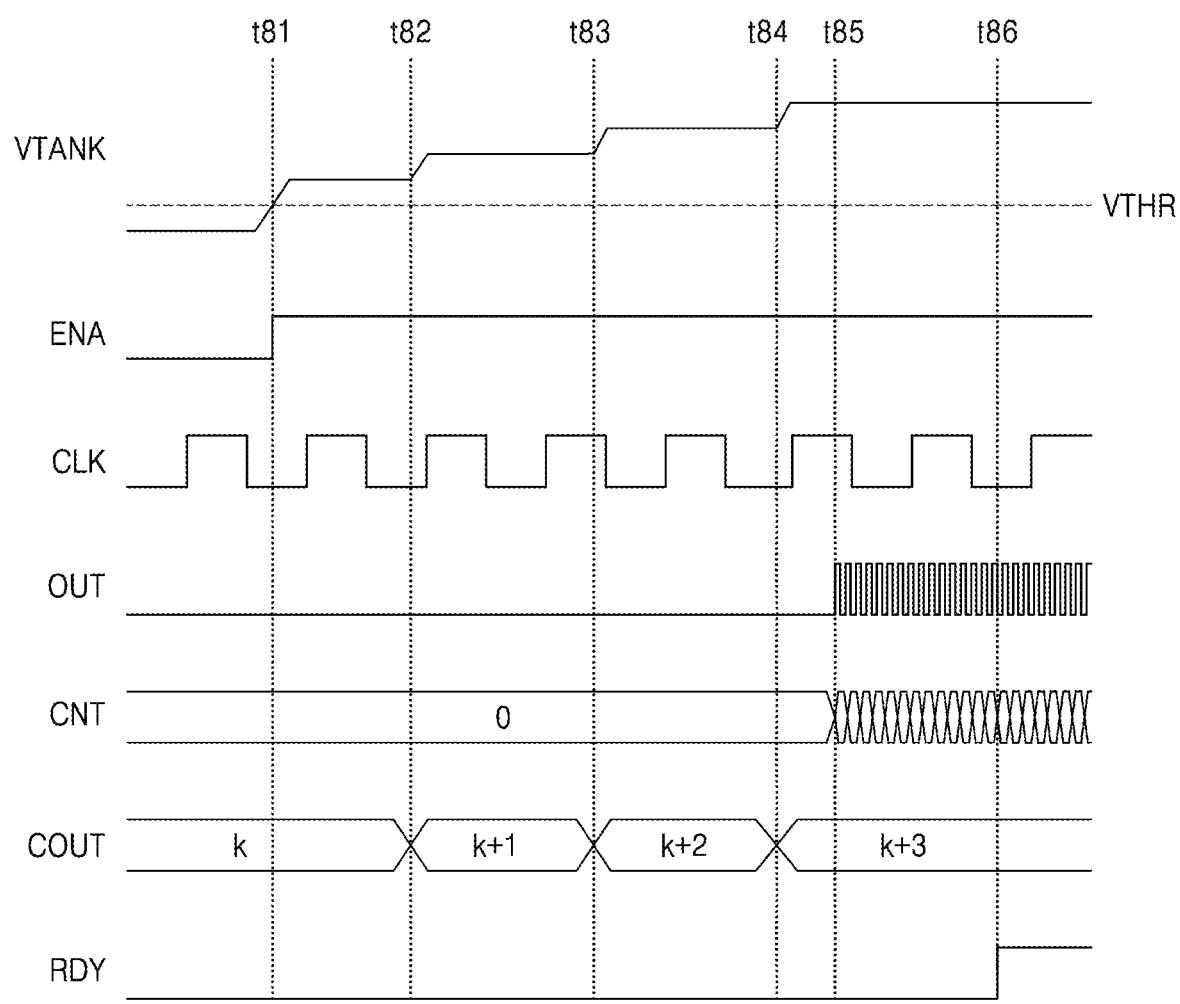
FIG. 8 is a timing diagram of an operation of detecting an optimum loop gain, according to some example embodiments.

FIG. 8 is a timing diagram of an operation of detecting an optimum loop gain, according to some example embodiments. For example, the timing diagram of FIG. 8 shows signals of FIG. 7 over time. In FIG. 8, the enable signal ENA and the ready signal RDY may be active high signals. Hereinafter, the diagram of FIG. 8 is described with reference to FIGS. 1 and 7, and descriptions that are the same as the descriptions of FIG. 5 are omitted from the descriptions of FIG. 8.

Referring to FIG. 8, at time t81, the positive supply voltage VTANK may increase above the threshold voltage VTHR. Thus, the comparator 74 may generate the activated enable signal ENA, and the counter 71 may count the transition of the output signal OUT in response to the activated enable signal ENA.

At time t82, a value of the control signal COUT may increase from k to k+1. For example, as shown in FIG. 8, the transition of the output signal OUT may not occur until the time t82, and thus, the count signal CNT may have a value of 0. That is, at the time t82, the loop gain corresponding to the positive supply voltage VTANK may be less than 1. The decision circuit 72 may compare 0, which is the value of the count signal CNT, with the reference value, determine that the output signal OUT does not oscillate, and increase the value of the control signal COUT by 1. In response to the control signal COUT with the increased value, the voltage regulator 15 may increase the positive supply voltage VTANK as shown in FIG. 8, and the increased positive supply voltage VTANK may be applied to the oscillator 13.

At time t83, the value of the control signal COUT may increase from k+1 to k+2. For example, as shown in FIG. 8, the transition of the output signal OUT may not occur until the time t83, and thus, the count signal CNT may have a value of 0. That is, at the time t83, the loop gain corresponding to the positive supply voltage VTANK may be less than 1. The decision circuit 72 may compare 0, which is the value of the count signal CNT, with the reference value, determine that the output signal OUT does not oscillate, and increase the value of the control signal COUT by 1. In response to the control signal COUT with the increased value, the voltage regulator 15 may increase the positive supply voltage VTANK as shown in FIG. 8, and the increased positive supply voltage VTANK may be applied to the oscillator 13.

At time t84, the value of the control signal COUT may increase from k+2 to k+3. For example, as shown in FIG. 8, the transition of the output signal OUT may not occur until the time t84, and thus, the count signal CNT may have a value of 0. That is, at the time t84, the loop gain corresponding to the positive supply voltage VTANK may be less than 1. The decision circuit 72 may compare 0, which is the value of the count signal CNT, with the reference value, determine that the output signal OUT does not oscillate, and increase the value of the control signal COUT by 1. In response to the control signal COUT with the increased value, the voltage regulator 15 may increase the positive supply voltage VTANK as shown in FIG. 8, and the increased positive supply voltage VTANK may be applied to the oscillator 13.

At time t85, the transition of the output signal OUT may occur. For example, at the time t85, the loop gain corresponding to the positive supply voltage VTANK may be greater than or equal to 1, and thus, the oscillator 13 may generate the output signal OUT that oscillates. Accordingly, as shown in FIG. 8, the value of the count signal CNT may increase.

At time t86, the ready signal RDY may be activated. For example, the decision circuit 72 may compare the value of the count signal CNT with the reference value and identify the value of the count signal CNT, which is greater than the reference value. Accordingly, the decision circuit 72 may determine the oscillation of the output signal OUT, maintain the value of the control signal COUT, and generate the activated ready signal RDY.

Figure 9:
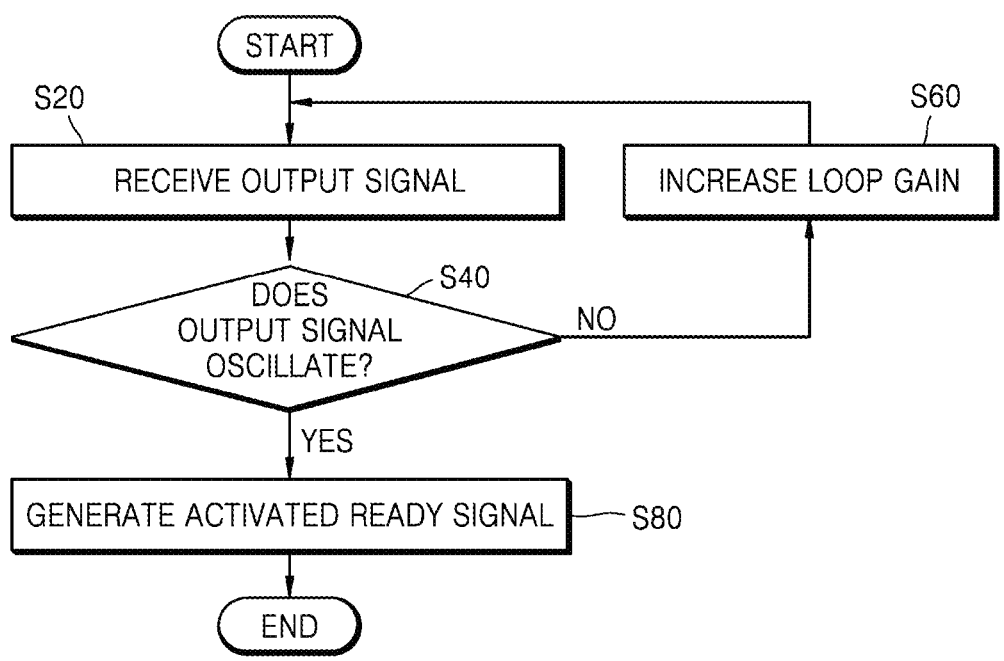
FIG. 9 is a flowchart of a method of controlling an oscillator, according to some example embodiments.

FIG. 9 is a flowchart of a method of controlling an oscillator, according to some example embodiments. In some example embodiments, the method of FIG. 9 may be referred to as a method of detecting an optimum loop gain of the oscillator. As shown in FIG. 9, the method of controlling an oscillator may include operations S20, S40, S60, and S80. In some example embodiments, the method of FIG. 9 may be performed by the controller 30 of FIG. 3. Hereinafter, the flowchart of FIG. 9 is described with reference to FIG. 3.

Referring to FIG. 9, in operation S20, the output signal OUT may be received. For example, the controller 30 may receive the output signal OUT generated by the oscillator. Also, the controller 30 may receive the clock signal CLK having a regular cycle.

In operation S40, the determination may be made as to whether the output signal OUT oscillates. For example, the controller 30 may count the transition of the output signal OUT received in operation S20 and detect the frequency of the output signal OUT based on the clock signal CLK. The controller 30 may determine the oscillation of the output signal OUT when the frequency of the output signal OUT is greater than or equal to the reference frequency and determine that the output signal OUT does not oscillate when the frequency of the output signal OUT is less than the reference frequency. An example of operation S40 is described with reference to FIG. 10. As shown in FIG. 9, when it is determined that the output signal OUT oscillates (e.g., S40=YES), operation S80 may be subsequently performed, and when it is determined that the output signal OUT does not oscillate (e.g., S40=NO), operation S60 may be subsequently performed.

When it is determined that the output signal OUT does not oscillate, the loop gain may increase in operation S60. For example, when it is determined in operation S40 that the output signal OUT does not oscillate, the controller 30 may identify a lack of loop gain, that is, the loop gain less than 1, and increase the loop gain. As described above with reference to the attached drawings, the controller 30 may increase the loop gain of the oscillator in various manners. An example of operation S60 is described with reference to FIG. 11. Operations S20 and S40 may be sequentially performed again after operation S60.

When it is determined that the output signal OUT oscillates, the activated ready signal RDY may be generated in operation S80. For example, when it is determined that the output signal OUT oscillates, the controller 30 may activate the ready signal RDY. At S80, the loop gain may be prevented from being further increased, such that the loop gain may be maintained at a minimum level, value, magnitude, etc. which causes the output signal OUT to oscillate, thereby optimizing (e.g., minimizing) power consumption to cause the output signal OUT to oscillate.

Figure 10:
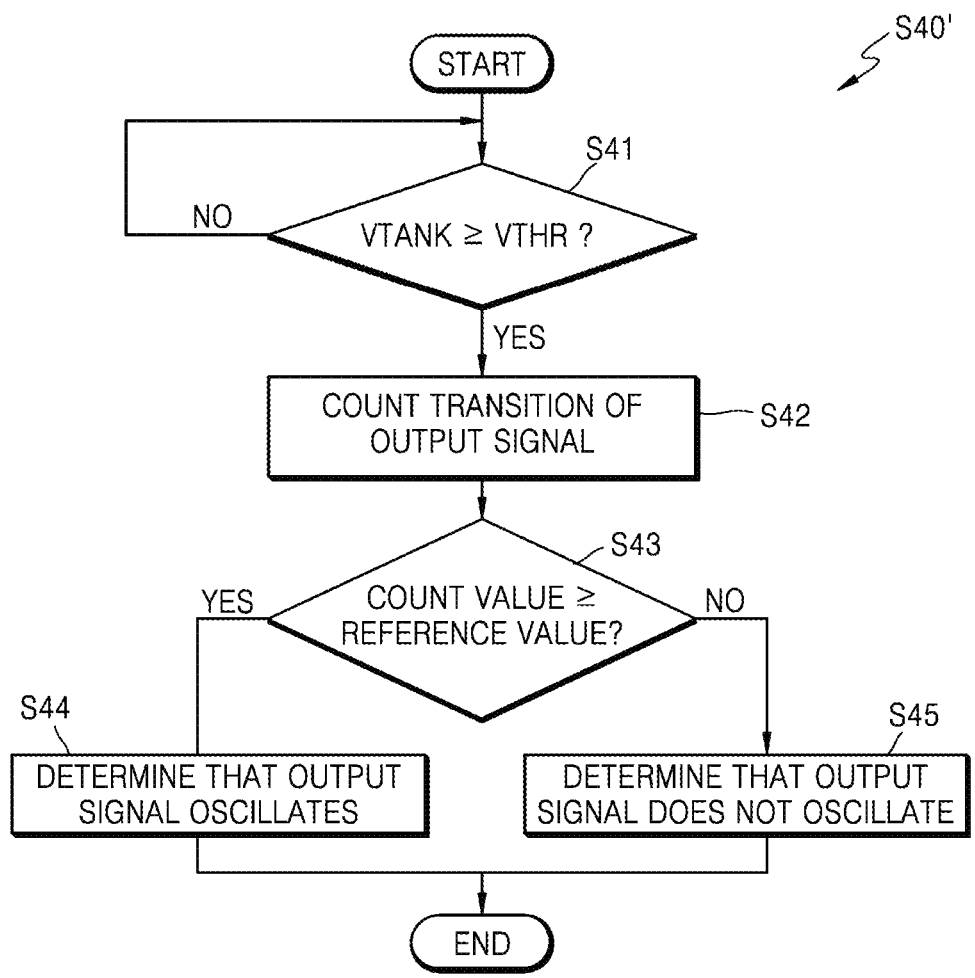
FIG. 10 is a flowchart of a method of controlling an oscillator, according to some example embodiments.

FIG. 10 is a flowchart of a method of controlling an oscillator, according to some example embodiments. For example, the flowchart of FIG. 10 shows the example of operation S40 of FIG. 9. As described above with reference to FIG. 9, the determination may be made as to whether the output signal OUT oscillates in operation S40' of FIG. 10. As shown in FIG. 10, operation S40' may include operations S41 to S45. In some example embodiments, operation S40' may be performed by the controller 70 of FIG. 7. Hereinafter, the flowchart of FIG. 10 is described with reference to FIG. 7.

Referring to FIG. 10, in operation S41, the positive supply voltage VTANK may be compared with the threshold voltage VTHR. For example, the comparator 74 may compare the positive supply voltage VTANK with the threshold voltage VTHR and thus generate the enable signal ENA. When the positive supply voltage VTANK is greater than or equal to the threshold voltage VTHR, the activated enable signal ENA may be generated, and when the positive supply voltage VTANK is less than the threshold voltage VTHR, the deactivated enable signal ENA may be generated. As shown in FIG. 10, when the positive supply voltage VTANK is less than the threshold voltage VTHR, operation S41 may be performed again, while when the positive supply voltage VTANK is greater than or equal to the threshold voltage VTHR, operation S42 may be subsequently performed.

In operation S42, the transition of the output signal OUT may be counted. For example, the counter 71 may count the transition of the output signal OUT based on the clock signal CLK and thus generate the count signal CNT. The counter 71 may reset the count signal CNT in every cycle of the clock signal CLK or the cycle of the signal divided from the clock signal CLK, and the count signal CNT may indicate the frequency of the output signal OUT accordingly.

In operation S43, the count value may be compared with the reference value. For example, the decision circuit 72 may receive the count signal CNT and compare the value of the count signal CNT, that is, the count value, with the reference value. As shown in FIG. 10, when the count value is greater than or equal to the reference value, that is, when the frequency of the output signal OUT is greater than or equal to the reference frequency, it may be determined in operation S44 that the output signal OUT oscillates. On the contrary, when the count value is less than the reference value, that is, when the frequency of the output signal OUT is less than the reference frequency, it may be determined in operation S45 that the output signal OUT does not oscillate.

Figure 11:
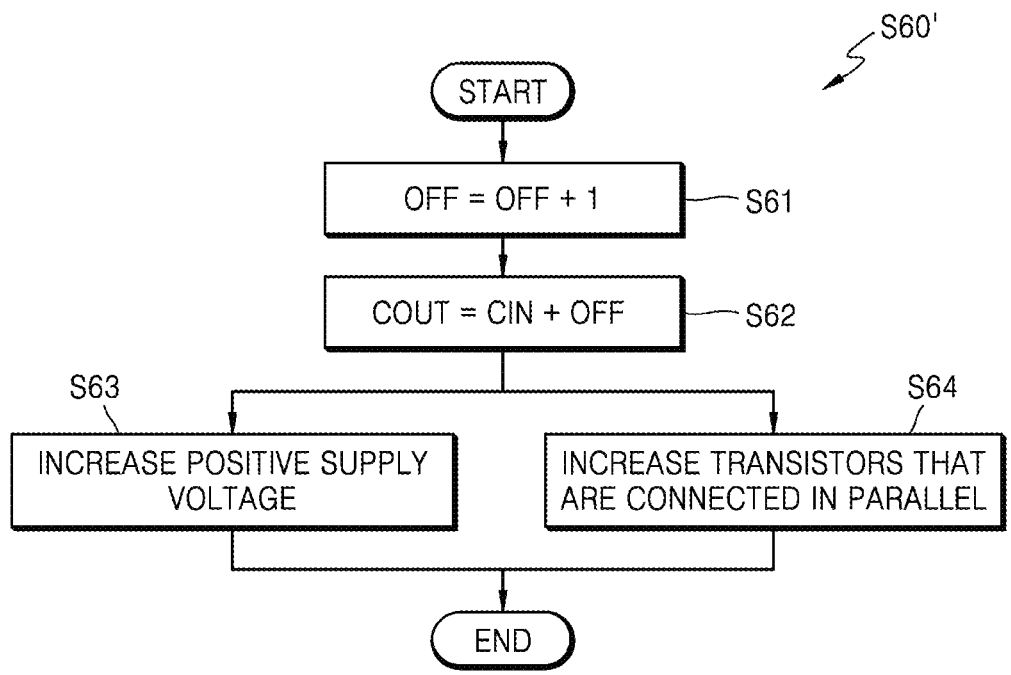
FIG. 11 is a flowchart of a method of controlling an oscillator, according to some example embodiments.

FIG. 11 is a flowchart of a method of controlling an oscillator, according to some example embodiments. For example, the flowchart of FIG. 11 shows the example of operation S60 of FIG. 9. As described above with reference to FIG. 9, the loop gain may increase in operation S60' of FIG. 11. As shown in FIG. 11, operation S60' may include operations S61 to S64. Hereinafter, the flowchart of FIG. 11 is described with reference to FIGS. 1 and 3.

Referring to FIG. 11, in operation S61, the offset signal OFF may be updated. For example, the decision circuit 32 may increase a value of the offset signal OFF, which is added to the input control signal CIN, to increase the loop gain of the oscillator 13. In some example embodiments, the decision circuit 32 may increase the value of the offset signal OFF by another positive value other than 1.

In operation S62, the control signal COUT may be updated. For example, the adder 33 may generate the control signal COUT by adding the input control signal CIN to the offset signal OFF. The control signal COUT may be increased according to the offset signal OFF with the value increased in operation S61. As shown in FIG. 11, operations S63 and S64 may be performed after operation S62. In some example embodiments, operations S63 and S64 may be sequentially performed. In some example embodiments, one of operations S63 or S64 may be omitted from operation S60'.

In operation S63, the positive supply voltage VTANK may increase. For example, the voltage regulator 15 may increase the positive supply voltage VTANK in response to the control signal COUT that is updated in operation S62. Accordingly, the transconductance may increase, and the loop gain of the oscillator 13 may increase.

In operation S64, a quantity of transistors connected in parallel (e.g., transistor connected in parallel in the oscillator 13) may be increased. As described above with reference to FIGS. 6A and 6B, for example, the oscillator 13 may include the transistors forming the negative GM cell and at least one switch connected to at least one of the transistors respectively. In response to the control signal COUT updated in operation S62, the switch may be turned on so that the number of transistors connected to each other in parallel may increase, and the effective sizes of the transistors may increase. Accordingly, the transconductance may increase, and the loop gain of the oscillator 13 may increase.

Figure 12:
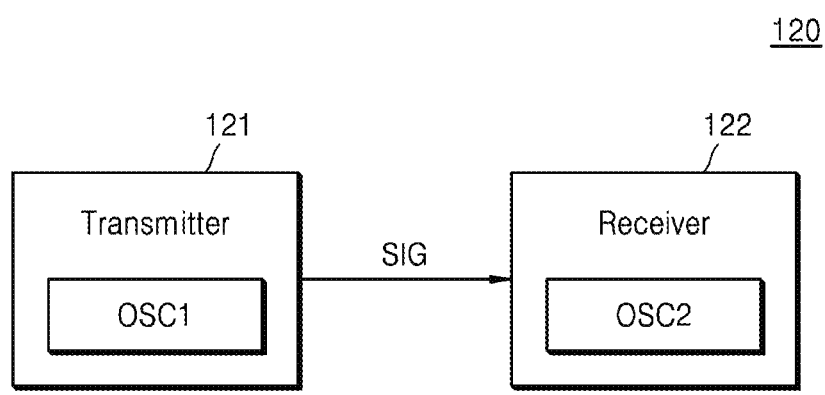
FIG. 12 is a block diagram of a communication system according to some example embodiments.

FIG. 12 is a block diagram of a communication system 120 according to some example embodiments. The device and/or the oscillator described above with reference to the attached drawings may be included in the communication system 120. As shown in FIG. 12, the communication system 120 may include a transmitter 121 and a receiver 122.

The transmitter 121 may transmit a signal SIG to the receiver 122 through a communication channel. In some example embodiments, the communication channel may be a wireless communication channel. For example, the communication system 120 may be a cellular communication system, such as long term evolution (LTE), LTE-advanced (LTE-A), new radio (NR), wireless broadband (WiBro), or global system for mobile communication (GSM), a near-field communication system, such as Bluetooth or near field communication (NFC), or a wireless local area network (WLAN) system, such as the IEEE 802.11 standard. In some example embodiments, the communication channel may be a wired communication channel. For example, the communication system 120 may include a bus, such as a peripheral component interconnect (PCI), or serial communication, such as a universal serial bus (USB).

As shown in FIG. 12, the transmitter 121 may include an oscillator OSC1, and the oscillator OSC1 may be used to generate the signal SIG. Also, the receiver 122 may include an oscillator OSC2, and the oscillator OSC2 may be used to process the signal SIG. For example, when the communication system 120 is a wireless communication system, an oscillation signal generated by the oscillator OSC1 of the transmitter 121 may be used to generate a radio frequency (RF) signal by up-converting a baseband signal. Also, an oscillation signal generated by the oscillator OSC2 of the receiver 122 may be used to generate a baseband signal by down-converting the RF signal. When the communication system 120 is a wired communication system, the oscillator OSC1 of the transmitter 121 and the oscillator OSC2 of the receiver 122 may be included in a serializer/deserializer (SerDes).

As described above with reference to the attached drawings, each of the transmitter 121 and the receiver 122 may include the device 10 shown in FIG. 1, including a phase detector, a voltage generator, a frequency divider, a voltage regulator, a controller, and an oscillator according to any of the example embodiments herein, such that each of the oscillator OSC1 and the oscillator OSC2 may be controlled to have an optimum loop gain as described herein with regard to the oscillators 13, 20a, 20b, and/or 20c, the controllers 16, 30, and/or 70, the voltage regulators 15 and/or 40, or the like, for example based on one or both of the transmitter 121 and the receiver 122 including an oscillator (e.g., OSC1 or OSC2) including at least one inductor and at least one capacitor and configured to generate, based on a positive supply voltage, an output signal oscillating in a resonance frequency of the at least one inductor and the at least one capacitor; and an oscillation detector configured to determine, based on a clock signal, whether the output signal oscillates and increase a loop gain of the oscillator until the output signal oscillates. Accordingly, oscillation signals with a high frequency and low jitter may be stably generated, and throughput of the communication system 120 may increase. In addition, power consumption by the oscillator OSC1 and the oscillator OSC2 and by the transmitter 121 and the receiver 122 may be reduced or minimized.

As described herein, any devices, systems, units, blocks, circuits, controllers, and/or portions thereof according to any of the example embodiments (including, for example, the device 10, the phase detector 11, the voltage generator 12, the oscillator 13, the frequency divider 14, the controller 16, the controller 30, the counter 31, the decision circuit 32, the adder 33, the controller 70, the counter 71, the decision circuit 72, the adder 73, the comparator 74, the communication system 120, the transmitter 121, the receiver 122, any portion thereof, or the like) may include, may be included in, and/or may be implemented by one or more instances of processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid-state drive memory device, storing a program of instructions, and a processor (e.g., CPU) configured to execute the program of instructions to implement the functionality and/or methods performed by some or all of any devices, systems, units, blocks, circuits, controllers, and/or portions thereof according to any of the example embodiments.

While the inventive concepts have been particularly shown and described with reference to some example embodiments thereof, it will be understood that various changes in form and details may be made therein without departing from the spirit and scope of the following claims.

What is claimed is:

1. A device, comprising:
an oscillator including at least one inductor and at least one capacitor, the oscillator configured to generate, based on a positive supply voltage, an output signal oscillating in a resonance frequency of the at least one inductor and the at least one capacitor; and
an oscillation detector configured to detect a frequency of the output signal according to a clock signal and determine, based on the detected frequency of the output signal, whether the output signal oscillates and increase a loop gain of the oscillator until the output signal oscillates.

2. The device of claim 1, further comprising a voltage regulator configured to generate the positive supply voltage regulated according to a control signal,
wherein the oscillation detector is configured to generate the control signal to increase the positive supply voltage.

3. The device of claim 2, wherein the oscillation detector is configured to receive an input control signal and generate the control signal based on adding, to the input control signal, an offset that gradually increases over time.

4. The device of claim 1, wherein the oscillator comprises:
at least one switch; and
a plurality of transistors connected to the at least one inductor and the at least one capacitor and connected to each other in parallel through the at least one switch, and
the oscillation detector is configured to sequentially turn on the at least one switch.

5. The device of claim 4, wherein each transistor of the plurality of transistors comprises an n-channel field effect transistor (NFET), and
each switch of the at least one switch is connected with one of the plurality of transistors in series.

6. The device of claim 4, wherein each transistor of the plurality of transistors comprises a p-channel field effect transistor (PFET), and each switch of the at least one switch is connected with one of the plurality of transistors in series.

7. The device of claim 1, wherein the oscillation detector comprises:
a counter configured to generate a count signal based on counting transition of the output signal based on the clock signal; and
a decision circuit configured to determine, based on the count signal, whether the output signal oscillates.

8. The device of claim 7, wherein the counter is configured to reset the count signal based on the clock signal.

9. The device of claim 8, wherein the counter is configured to
generate a signal that is divided from the clock signal to be a divided signal, and
reset the count signal every cycle of the divided signal.

10. The device of claim 7, wherein the decision circuit is configured to determine that the output signal oscillates in response to a determination that a value of the count signal is greater than a reference value.

11. The device of claim 7, wherein the decision circuit is configured to collect a plurality of values of the count signal and determine that the output signal oscillates in response to a determination that an average of the plurality of values is greater than a reference value.

12. The device of claim 7, wherein the oscillation detector further comprises a comparator configured to compare the positive supply voltage with a threshold voltage and enable the counter in response to a determination that the positive supply voltage is greater than or equal to the threshold voltage.

13. The device of claim 1, wherein the at least one capacitor comprises a variable capacitor with capacitance adjusted according to an input voltage.

14. A method of controlling an oscillator, the oscillator including at least one inductor and at least one capacitor, the method comprising:
receiving an output signal oscillating in a resonance frequency of the at least one inductor and the at least one capacitor, the output signal being generated by the oscillator based on a positive supply voltage;
detecting a frequency of the output signal according to a clock signal and determining, based on the detected frequency of the output signal, whether the output signal oscillates; and
increasing a loop gain of the oscillator until the output signal oscillates.

15. The method of claim 14, further comprising generating the positive supply voltage based on a control signal,
wherein the increasing the loop gain comprises generating the control signal to increase the positive supply voltage.

16. The method of claim 14, wherein the oscillator comprises a plurality of transistors, and
the increasing the loop gain comprises increasing a number of transistors that are connected to each other in parallel from among the plurality of transistors.

17. The method of claim 14, wherein the determining whether the output signal oscillates comprises:
counting transition of the output signal based on the clock signal; and
determining whether the output signal oscillates based on a count value.

18. The method of claim 17, further comprising comparing the positive supply voltage with a threshold voltage,
wherein the counting the transition of the output signal is performed in response to a determination that the positive supply voltage is greater than or equal to the threshold voltage.

19. A device, comprising:
a phase detector configured to detect a phase difference between a clock signal and a feedback signal;
a voltage generator configured to generate an input voltage based on the phase difference;
an oscillator configured to generate an output signal with a frequency that is adjusted according to the input voltage;
a frequency divider configured to generate the feedback signal based on dividing the output signal; and
a controller configured to determine whether the output signal oscillates and increase a loop gain of the oscillator until the output signal oscillates,
wherein the controller is configured to detect the frequency of the output signal according to the clock signal and determine, based on the detected frequency of the output signal, whether the output signal oscillates.

* * * * *